United States Patent [19]
Hofmeister

[11] Patent Number: 5,720,590
[45] Date of Patent: Feb. 24, 1998

[54] ARTICULATED ARM TRANSFER DEVICE

[75] Inventor: Christopher Hofmeister, Hampstead, N.H.

[73] Assignee: Brooks Automation, Inc., Chelmsford, Mass.

[21] Appl. No.: 434,012

[22] Filed: May 3, 1995

Related U.S. Application Data

[63] Continuation of Ser. No. 48,833, Apr. 16, 1993, abandoned.

[51] Int. Cl.$^6$ .................................................. B25J 9/12
[52] U.S. Cl. ..................... 414/744.2; 901/15; 414/744.2
[58] Field of Search ..................... 414/744.5, 744.2; 901/15, 23, 24; 310/67 R, 88, 101, 103; 318/567

[56] References Cited

U.S. PATENT DOCUMENTS

| | | | |
|---|---|---|---|
| 1,190,215 | 7/1916 | Becker . | |
| 2,282,608 | 5/1942 | Rempel . | |
| 3,730,595 | 5/1973 | Yakubowski | 302/2 R |
| 3,768,714 | 10/1973 | Applequist | 192/12 D X |
| 3,823,836 | 7/1974 | Cheney et al. | 214/16.4 R |
| 3,874,525 | 4/1975 | Hassan et al. | 214/17 B |
| 4,062,463 | 12/1977 | Hillman et al. | 214/301 |
| 4,109,170 | 8/1978 | Fujita et al. | 310/112 X |
| 4,208,159 | 6/1980 | Uehara et al. | 414/225 |
| 4,666,366 | 5/1987 | Davis | 414/749 |
| 4,712,971 | 12/1987 | Fyler | 414/744.5 |
| 4,721,971 | 1/1988 | Scott | 354/105 |
| 4,730,975 | 3/1988 | Munakata | 414/735 |
| 4,784,010 | 11/1988 | Wood et al. | 74/479 |
| 4,808,864 | 2/1989 | Brunet et al. | 310/52 |
| 4,907,467 | 3/1990 | Toyoda et al. | 74/479 BP |
| 4,909,701 | 3/1990 | Hardegen et al. | 414/749 |
| 4,951,601 | 8/1990 | Maydan et al. | 118/719 |
| 5,147,175 | 9/1992 | Tada | 414/749 |
| 5,151,008 | 9/1992 | Ishida et al. | 414/744.5 |
| 5,180,276 | 1/1993 | Hendrickson | 414/752 |
| 5,209,699 | 5/1993 | Hashimoto et al. | 464/29 |
| 5,270,600 | 12/1993 | Hashimoto | 310/75 D |
| 5,333,986 | 8/1994 | Mizukami et al. | 414/217 |
| 5,431,529 | 7/1995 | Eastman et al. | 414/744.5 |
| 5,447,409 | 9/1995 | Grunes et al. | 414/744.6 |
| 5,583,408 | 12/1996 | Lowrance | 318/568.1 |
| 5,656,902 | 8/1997 | Lowrance | 318/568.1 |

FOREIGN PATENT DOCUMENTS

| | | |
|---|---|---|
| 0423608 | 4/1991 | European Pat. Off. . |
| 0 501 427 A1 | 9/1992 | European Pat. Off. . |
| 2 633 863 | 1/1990 | France . |
| 60-6372 | 1/1985 | Japan . |
| 60-146689 | 8/1985 | Japan . |
| 1-177990 | 7/1989 | Japan . |
| 1-120336 | 8/1989 | Japan . |
| 2292153 | 3/1990 | Japan ...................... 414/744.5 |
| 4-89683 | 8/1992 | Japan . |
| 4-271287 | 9/1992 | Japan . |

OTHER PUBLICATIONS

M & K Series, Literature from MFM Technology, Inc., pp. 81-87.

*Primary Examiner*—Donald W. Underwood
*Attorney, Agent, or Firm*—Perman & Green, LLP

[57] ABSTRACT

A concentric-shaft rotational drive system for an articulated arm transfer device adaptable for imparting movement to an assembly inside a vacuum chamber wherein rotary movement is imparted to rotors inside the vacuum chamber by means of magnetic fields produced by stators outside the vacuum chamber.

24 Claims, 7 Drawing Sheets

ARTICULATED ARM TRANSFER DEVICE

This is a continuation of application Ser. No. 08/048,833 filed on Apr. 16, 1993, now abandoned.

BACKGROUND OF THE INVENTION

1. Field of the Invention

The apparatus of the present invention relates generally to material transfer devices. The material transferred might include, but not be limited to, semiconductor wafers, such as Silicon and Gallium Arsenide, semiconductor packaging substrates, such as High Density Interconnects, semiconductor manufacturing process imaging plates, such as masks or reticles, and large area display panels, such as Active Matrix LCD substrates.

2. Description of the Prior Art

The transfer of delicate silicon wafers or the like between a plurality of work stations or locations in the manufacture of semiconductor devices presents unique handling problems. The silicon wafers are very delicate and have highly polished surfaces. When the wafers are abruptly moved, they tend to slide. This sliding action can cause the silicon wafers to abrade or alternatively can cause damage to their edges if they collide.

There are numerous devices described in the prior art for transferring silicon wafers. For example:

U.S. Pat. No. 3,823,836 discloses an apparatus which includes a supply carrier with a plurality of ledges to hold the silicon wafers and a withdrawal device having a vacuum chuck. The vacuum chuck is attached to an elevator which raises and lowers the chuck. A horizontal transfer arm coupled to the vacuum chuck is used to transfer the silicon wafer from the supply carrier to a desired work station.

U.S. Pat. No. 3,370,595 discloses a wafer transfer handling apparatus having an indexable carrier for transferring wafers to and from work stations. Wafers enter and leave the wafer carrier on an air slide with the aid of a wafer ejector acceptor arm having directional air jets. The wafer ejector acceptor arm controls the driving of the wafers into or out of the carrier from or onto the air slide, which moves the wafers to or from a work station.

U.S. Pat. Nos. 4,062,463, 3,874,525 and 4,208,150 also disclose wafer transfer devices which include either pneumatic components or gripping devices for handling the wafers.

U.S. Pat. Nos. 4,666,366 and 4,909,701 disclose wafer transfer handling apparatus having an articulated arm assembly which extends and retracts in a "froglike" motion to transfer an object such as a wafer between a plurality of locations. Two articulated arms are operatively coupled such that when one arm is driven by a motor the articulated arms extend and retract in a "froglike" or "frogkick" type of motion. A platform is coupled to the arms and has the object to be transferred disposed thereon.

U.S. Pat. No. 4,951,601 discloses wafer transfer handling apparatus having an articulated arm assembly which includes a concentric-shaft, rotational drive system. However, such drive system requires rotary seals which can contaminate the vacuum chamber. In the drive system of U.S. Pat. No. 4,951,601 the inner shaft 98 is mounted on a drum 111 which is rotated by a cable 113 mounted on a drive 115 which is rotated by a belt. It appears that the drive 115 rotates in an aperture in the vacuum chamber, thus requiring a rotary seal. The hollow middle shaft 96 is mounted on a drum 101 which is rotated by a cable 103 mounted on a drive 100 which is rotated by a belt. It is not clear which components are inside the vacuum, but it seems clear that some rotating member must rotate in an aperture in the vacuum chamber, thus requiring a rotary seal. The device of the present invention has no such rotary seals. All bearings of the present invention are entirely within the vacuum, and all rotating parts are entirely within the vacuum.

SUMMARY OF THE INVENTION

The present invention provides a concentric-shaft rotational drive system for an articulated arm transfer device adapted to transfer objects, such as silicon wafers, camera lenses, crystal oscillators, or the like, between a plurality of locations disposed in various axial and radial planes.

The drive system permits the entire articulated arm assembly to be rotated in a radial plane. Like the apparatus of the prior art, such rotation is done when the end effector is not in an extended position.

The drive system also permits the platform assembly to be displaced in an axial direction. The assembly is adaptable for use in a variety of environments, including operation in a vacuum chamber or other controlled environment. The assembly may be mounted for movement inside a vacuum chamber with a vacuum seal between the assembly and its support.

DETAILED DESCRIPTION OF THE INVENTION

Figure 1:
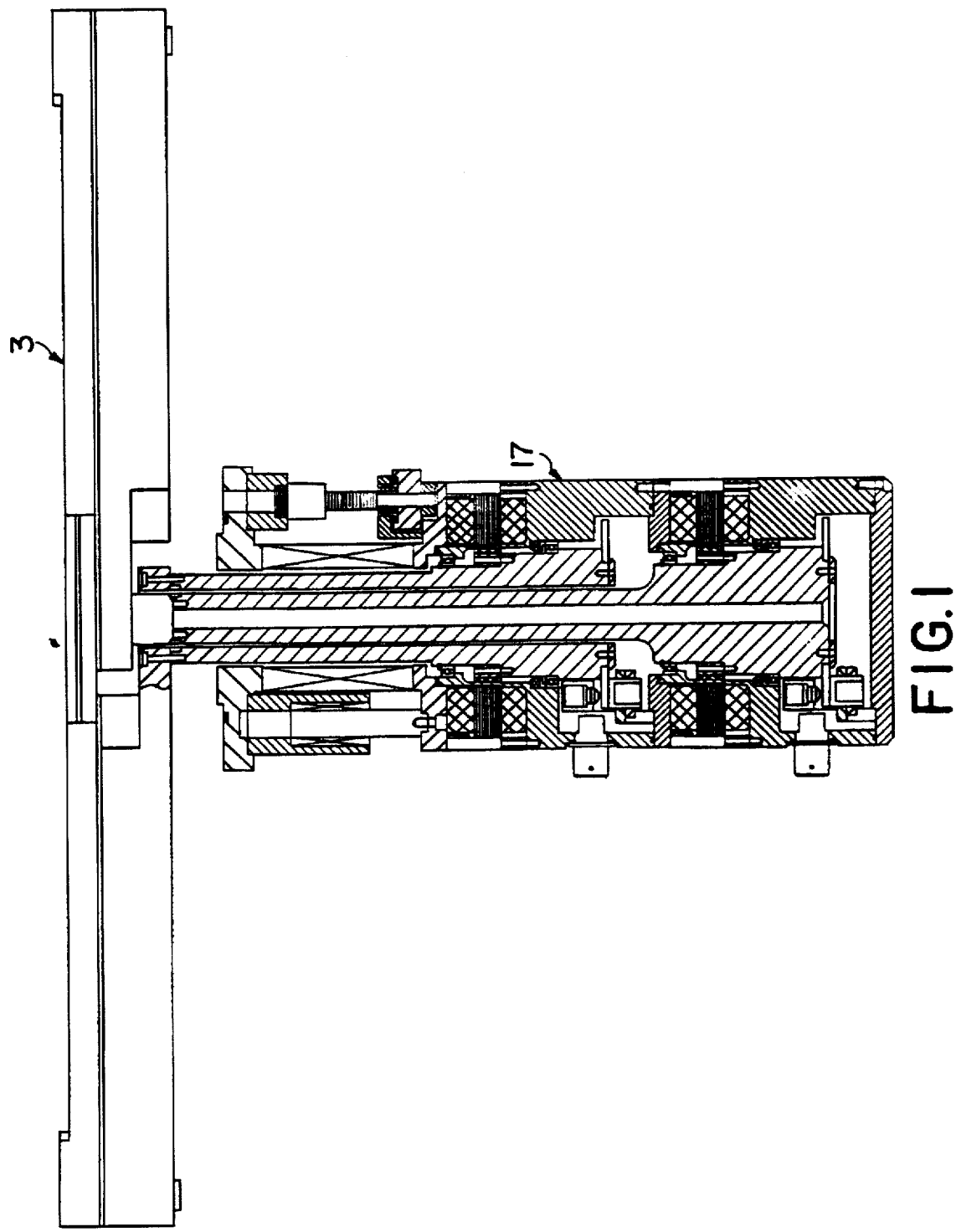
FIG. 1 is a central section through a dual-shaft device constructed in accordance with the invention and connected so as to drive an articulated arm transfer device of the type disclosed in U.S. Pat. No. 5,180,276 to Hendrickson and assigned to the assignee of the instant application.

Referring to FIGS. 1 through 4, a mounting flange 1 is attached to an apertured region of the bottom wall 2 of a vacuum chamber within which an articulated arm transfer device 3 is supported. The mounting flange itself has a central aperture through which two concentric output shafts extend. The outer shaft is designated 4, and the inner shaft is designated 5. At the extremities of the output shafts within the vacuum chamber a pilot bearing 6 separates the shafts and supports them upon each other. The two shafts are independently rotatable. However, in the preferred embodiment of the invention the relative motion of the shafts is limited to one in which they rotate together, and another in which they rotate in opposite directions. The former motion serves to rotate the articulated arm transfer device, and the latter motion serves to extend and retract the articulated arm transfer device.

The inner shaft is longer than the outer shaft, and the extremity of the inner shaft outside the vacuum chamber extends beyond the corresponding extremity of the outer shaft and attains a maximum outer diameter corresponding to that of the outer shaft. A rotor 7 is supported on the outer surface of the outer shaft 4, and a corresponding stator 8 is supported outside the rotor 7. Similarly, a rotor 9 is supported on the outer surface of the inner shaft 5, and a corresponding stator 10 is supported outside the rotor 9. Each stator is part of a drive which rotates the corresponding shaft. As appears hereinafter, each rotor is inside the vacuum and each stator is outside the vacuum.

Each rotor-stator pair 7,8 and 9,10 may form part of a conventional brushless DC motor such as the M & K Series manufactured by MFM Technology, Inc., 200 Thirteenth Avenue, Ronkonkoma, N.Y. 11779.

Rotary motion is imparted to each shaft by well-known servomechanism techniques, wherein a suitable signal is applied to the coils of the stators.

The varying position of each shaft as it rotates is detected by a suitable sensing mechanism in combination which a suitable coded disk or the like. For example, a coded pattern of opaque portions on a transparent disk may be caused to pass between a light source and a light detector. In lieu of such an optical sensing mechanism, a magnetic sensing mechanism may be employed wherein a coded pattern of magnetized portions on a magnetic disk may be magnetically scanned. Alternatively, the sensing mechanism may be mechanical, such as a combination of a gear and a switch, or it may be acoustical, with rotation of each shaft producing coded clicks of some sort; even electrostatic systems may be designed. For purposes of illlustration, and without limiting the scope of the invention thereto, an optical sensing mechanism will now be described.

A disk 11 is affixed to the outer extremity of the outer shaft 4 by a clamp plate 12. This disk has a coded pattern of opaque portions which pass between a light-emitting-diode housing 13 and a read head 14, from which a signal is transmitted to the appropriate external circuit through a signal feedthrough 15. The light-emitting-diode housing 13, the read head 14, and the signal feedthrough 15 are supported on a drive housing 16 which is fixed and forms part of a vacuum-tight tubular casing 17. The rotor 7 is affixed to the outer shaft 4, and the stator 8 is affixed to the drive housing 16 by a stator clamp 18, positioned so that the stator 8 can co-act with the rotor 7; and two bearings 19, 20 are provided between the outer shaft 4 and the corresponding drive housing 16 upon which that drive is mounted. Similarly, a disk 31 is affixed to the outer extremity of the inner shaft 5 by a clamp plate 32. This disk has a coded pattern of opaque portions which pass between a light-emitting-diode housing 33 and a read head 34, from which a signal is transmitted to the appropriate external circuit through a signal feedthrough 35. The rotor 9 is affixed to the inner shaft 5, and the stator 10 is affixed to the drive housing 36 by a stator clamp 37, positioned so that the stator 10 can co-act with the rotor 9; and two bearings 38, 39 are provided between the inner shaft 5 and the corresponding drive housing 36 upon which that drive is mounted.

The drive housings 16, 36 are of special configuration, and provide an important part of the vacuum-tight casing 17 which separates the evacuated regions of the device from the atmospheric-air regions of the device. The two drive housings are similar in shape and are connected to each other by an adapter 40.

Vertical motion may be imparted to the shafts by vertical movement of the drive housings which in turn are supported on two linear slides 41 and two lead screws 42. Alternates to the lead screws with rotary motors may be linear motors (servo or stepper) or a voice-coil or solenoid. The vertically movable drive housings are separated from the mounting flange by suitable bellows 43, and the outer extremity of the outermost drive housing is closed off by an end cap 44. Thus the entire region within the bellows, drive housings and end cap may be evacuated, and frictional motion inside this evacuated region is limited to that of the various bearings.

Each drive housing has a portion which passes between its respective rotor and stator, and sufficient clearance must be provided between the rotor and this part of the drive housing.

Figure 5:
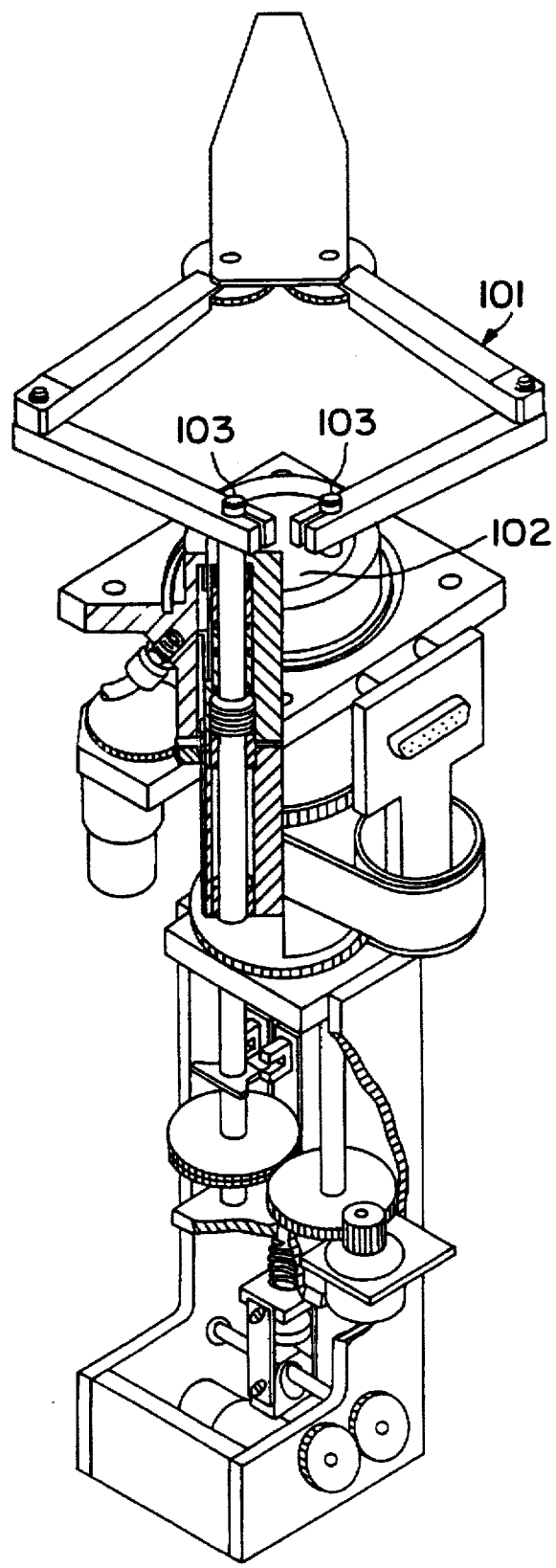
FIG. 5 is an isometric sketch of a prior art device.

A prior art device is shown in FIG. 5. Rotary motion is imparted to the articulated arm transfer device by rotating the rotate plug. Extension and retraction of the frog-legs is achieved by counter-rotation of the extend/retract drive shafts. The structure of the present invention reduces the number and type of seals required by the use of concentric shafts constructed in a particular way. The prior-art device shows that control may be effected by (1) simple rotation of a shaft and (2) counter-rotation of two shafts. In the device of the invention, (1) is provided when the concentric shafts rotate together and (2) is provided when the concentric shafts counter-rotate. In this device rotary motion is not limited by the basic mechanism, but may continue in either direction for any desired angle.

The three motions (vertical, rotary and extend/retract) may be simultaneously activated to provide any desired trajectory of the end effector. On the other hand, in some applications all three motions may not necessarily be activated, and the scope of the invention includes devices in which only one or two of the aforementioned three motions are activated.

Figure 2:
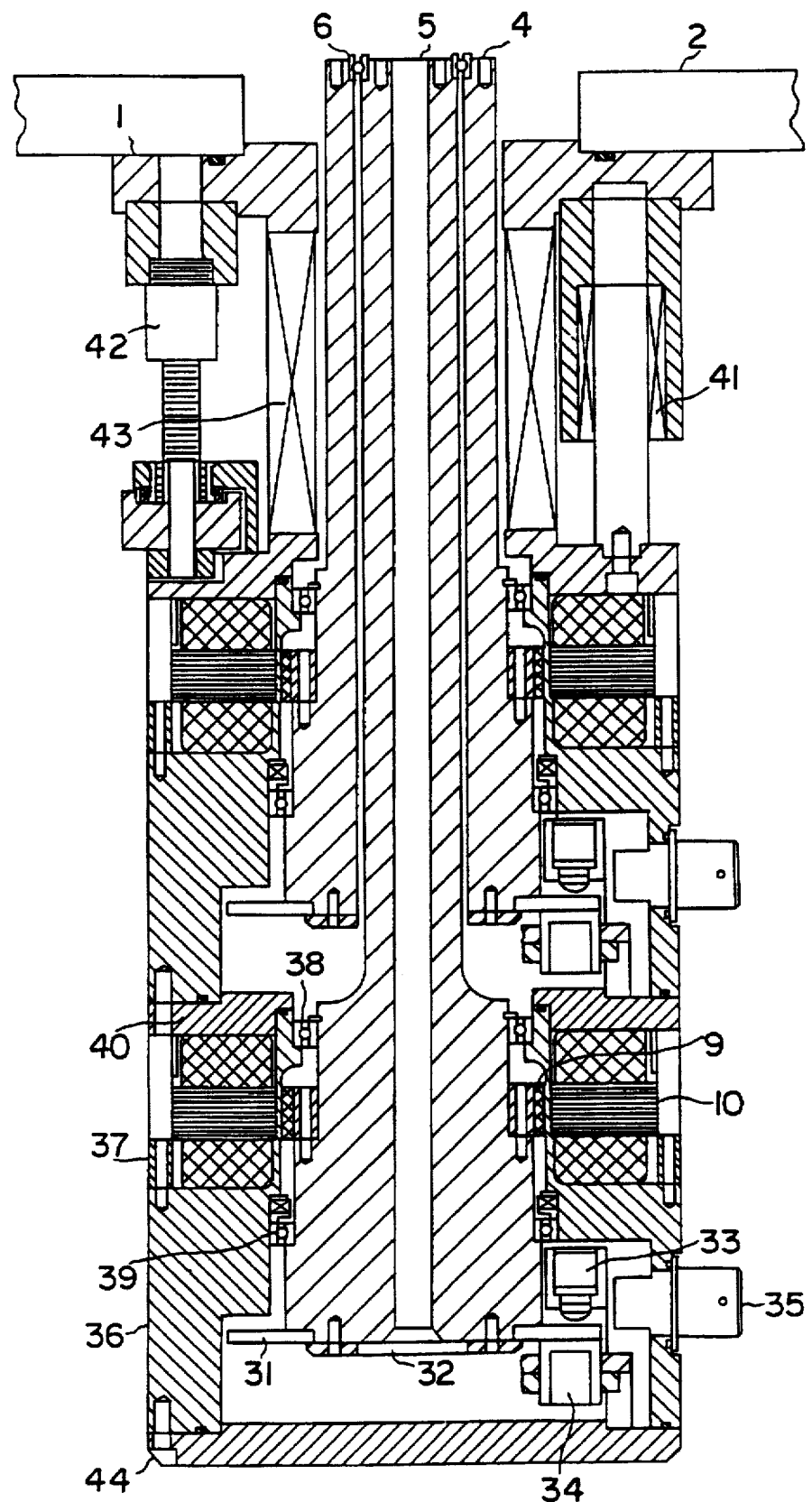
FIG. 2 is a detail of a portion of the central section of FIG. 1.
Figure 3:
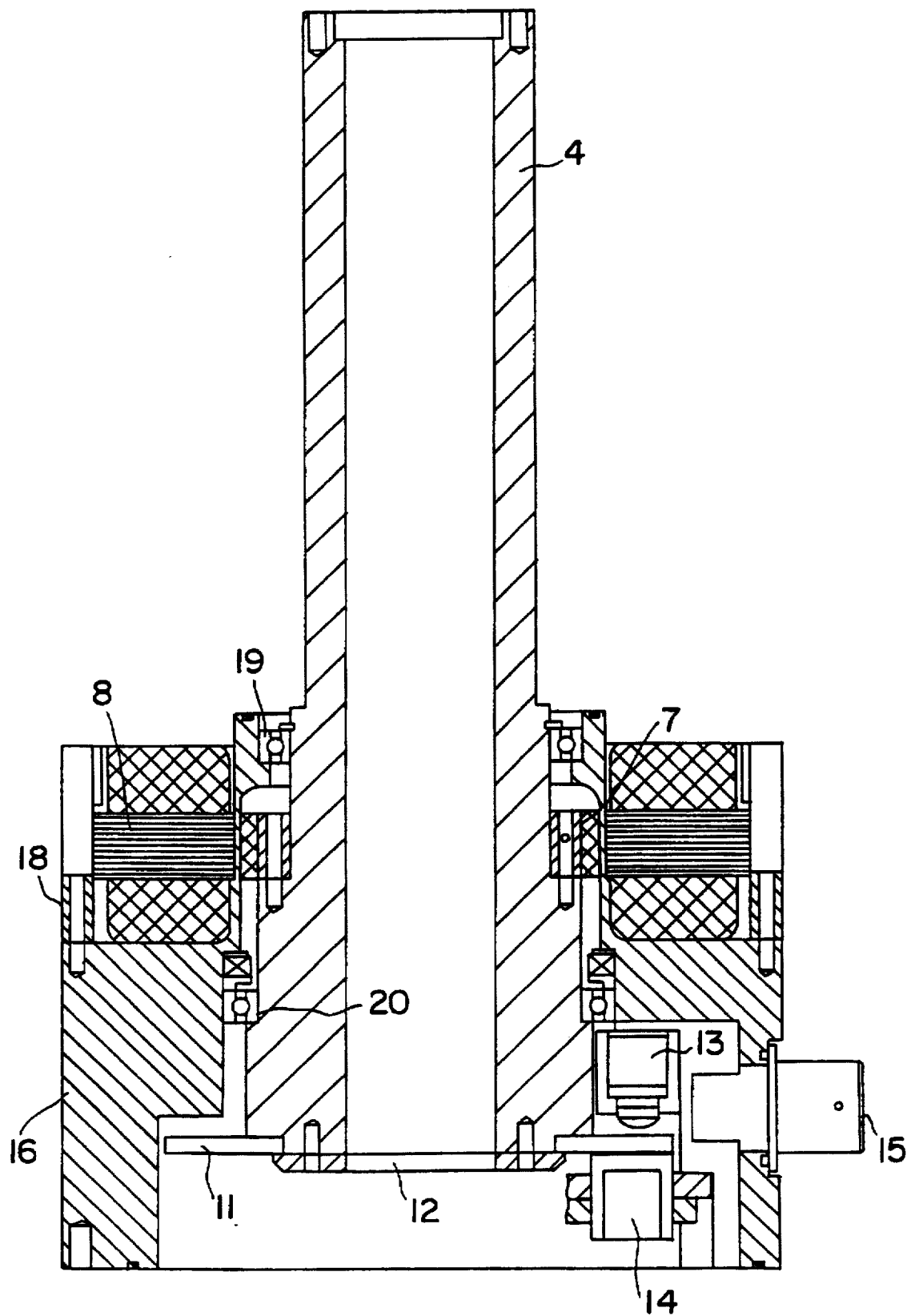
FIG. 3 is a detail of a portion of the central section of FIG. 2.
Figure 4:
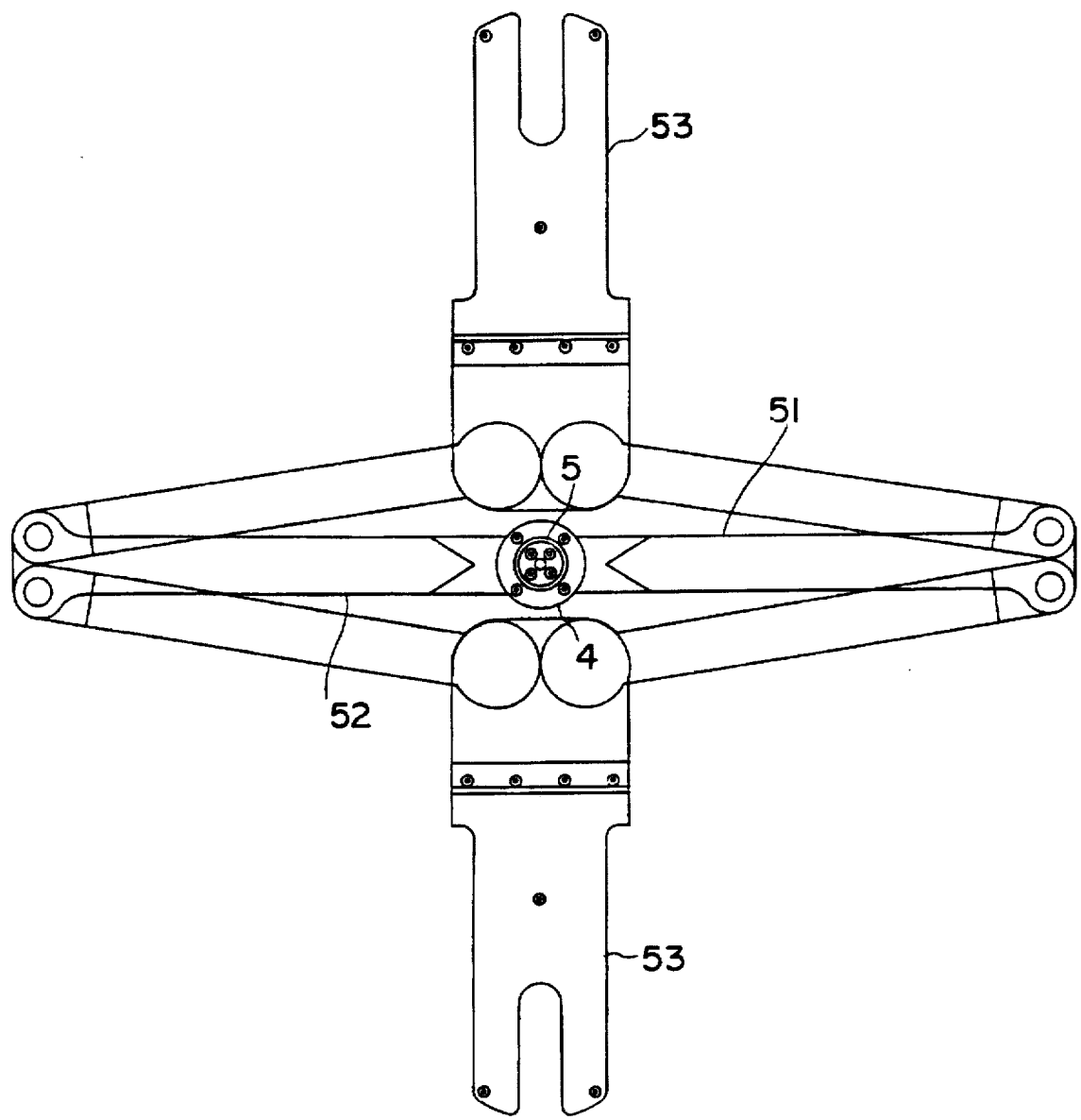
FIG. 4 is a plan view of the device of FIG. 1.

Referring now to FIG. 4 in conjunction with FIGS. 1–3, the outer shaft 4 is connected to one upper arm 51 and the inner shaft 5 is connected to the other upper arm 52 of an articulated arm transfer device such as that shown in the aforementioned U.S. Pat. No. 5,180,276. For θ motion (i.e. rotation of the end effectors 53) both rotors 7, 9 turn in synchronism in one direction. For R motion (i.e. extension and retraction of the end effectors 53) each rotor 7, 9 mirrors the other with equal but opposite rotation. These motions are computer controlled, using inputs from the two encoders.

When rotors 7, 9 turn in synchronism in one direction, shafts 4, 5 also turn in that direction. Referring to FIG. 4, if the shafts 4, 5 turn clockwise, the upper arms 51, 52 also turn clockwise, along with the rest of the apparatus shown in FIG. 4. Conversely, if the shafts 4, 5 turn counterclockwise, the entire apparatus shown in FIG. 4 turns counterclockwise. If, on the other hand, the outer shaft 4 turns clockwise while the inner shaft 5 turns counterclockwise, the upper arm 51 will turn clockwise and the upper arm 52 will turn counterclockwise. The resulting movement of both end effectors 53 is downward in FIG. 4. Conversely, if the outer shaft 4 turns counterclockwise while the inner shaft 5 turns clockwise, the upper arm 51 will turn counterclockwise and the upper arm 52 will turn clockwise. The resulting movement of both end effectors 53 is upward in FIG. 4.

Figure 6:
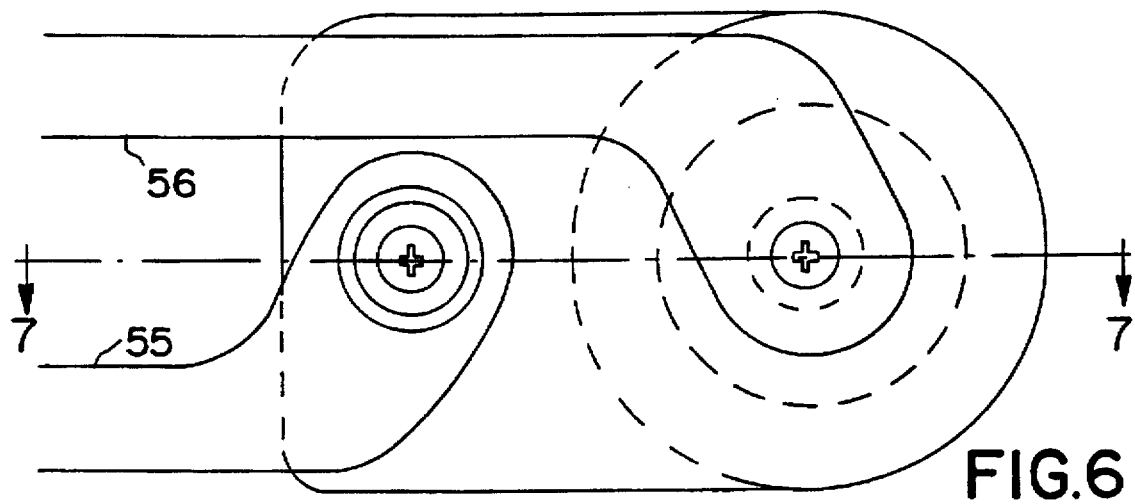
FIG. 6 is a plan view of the device of FIG. 1 but modified to drive an articulated arm transfer device of the type disclosed in co-pending application Ser. No. 997,773 filed Dec. 28, 1992 by Eastman and Davis and assigned to the assignee of the present application, now U.S. Pat. No. 5,431,529.
Figure 7:
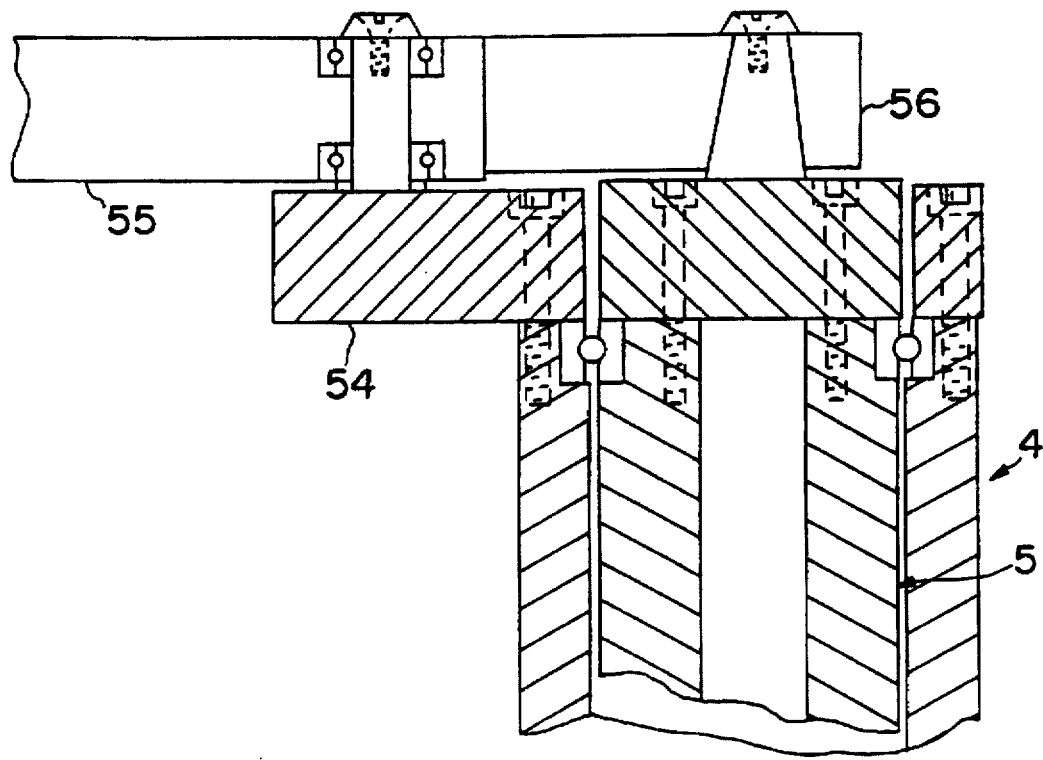
FIG. 7 is a central section along the line 7—7 of FIG. 6.

Referring now to FIGS. 6 and 7, the outer shaft 4 has affixed thereto a block 54 in which the upper slave arm 55 of an articulated arm transfer device such as that shown in the aforementioned co-pending application Ser. No. 997,773 is rotatably supported. The upper drive arm 56 of such an articulated arm transfer device is affixed to the inner shaft 5 so as to rotate therewith. In this case the two shafts rotate in synchronism for θ motion, but the outer shaft 4 is held fixed and only the inner shaft 5 is rotated for radial motion.

If an articulated arm transfer device of the type shown in the aforementioned U.S. Pat. Nos. 4,666,366 and 4,909,701 (such as shown in FIG. 5) is made with two concentric shafts, an outer shaft to rotate the arms in θ motion and an inner shaft to generate extend/retract motion, it is possible to rotate the appropriate shaft combinations with one motor (and encoder) by using two brakes, one of which will lock the inner shaft to the outer shaft, and the other the outer shaft to the casing.

If the outer shaft is locked to the casing, and the shoulder assembly is mounted on the outer (rotate) shaft, no rotation of the shoulder will be possible. Rotation of the inner shaft by a motor attached to it will generate extend-retract motion as is now done by the extend/retract motor of an articulated arm transfer device of the type shown in FIG. 5.

Conversely, if the inner shaft is locked to the outer shaft, no extend/retract motion is possible. If, therefore, the outer shaft/casing brake is released, rotation of the inner shaft by the motor will result in simultaneously rotating the outer shaft, and therefore in θ motion.

If both brakes are locked at the end of each motion, and then the appropriate brake is released, one encoder, when its signal is combined in a computer with the brake command, can indicate the motion of either parameter. If greater precision is required, two encoders, as in FIG. 1 (11, 31) may be used.

By proper design and use of magnetic and non-magnetic materials, it is possible to mount all moving parts, including brake shoes and motor rotors, inside of a sealed cylindrical case, while placing the magnet coils of all components in atmosphere outside the casing. This will eliminate the known outgassing problems and electrical feedthroughs which degrade performance of systems having active electromagnets in vacuum.

While this mechanism will work with any of the extending arm assemblies typical of robots manufactured by the assignee of the instant application, a particular advantage is achieved when using the aforementioned arm shown in FIGS. 6 and 7 and used in articulated arm transfer devices of the type disclosed in the aforementioned co-pending application Ser. No. 997,773, in that only one driving shaft is required at the shoulder, eliminating the need of gearing on top of the rotating shafts.

Figure 8:
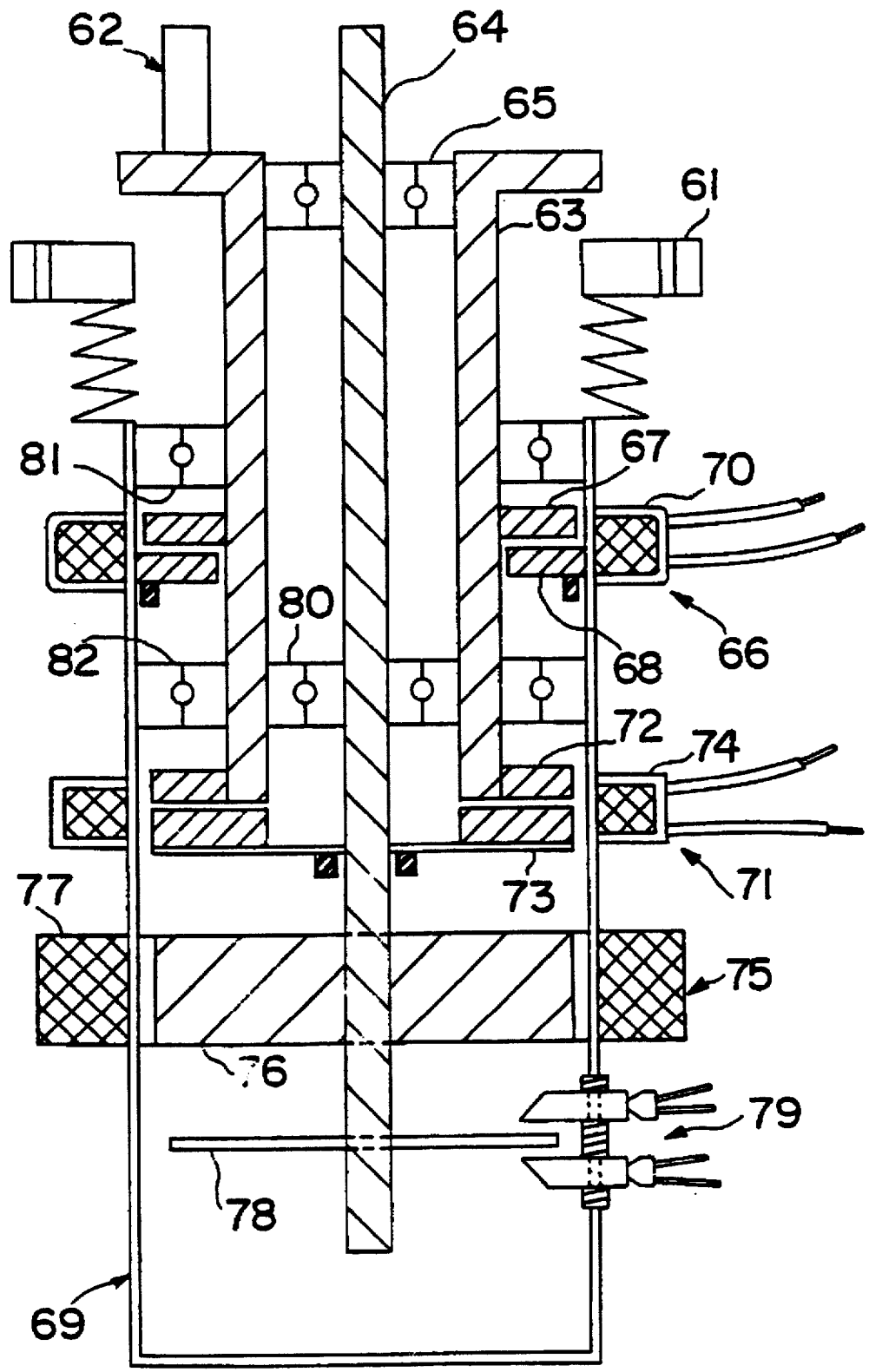
FIG. 8 is a central section similar to that of FIG. 1 and showing another embodiment of the invention in which a single motor and two brakes are employed.

Referring now to FIG. 8, a mounting flange 61 is attached to an apertured region of the bottom wall of a vacuum chamber within which an articulated arm transfer device 62 is supported. The articulated arm transfer device 62 is shown as being of the type shown in FIGS. 4 and 5. The mounting flange itself has a central aperture through which two concentric output shafts extend. The outer shaft is designated 63, and the inner shaft is designated 64. At the extremities of the output shafts within the vacuum chamber a pilot bearing 65 separates the shafts and supports them upon each other. The two shafts are independently rotatable. However, in the device of FIG. 8 only one shaft is rotatably driven by a motor, and rotation of the other shaft is determined by two brakes, one of which causes the shafts to rotate together, and another of which causes the other shaft to remain fixed. The former motion serves to rotate the articulated arm transfer device, and the latter motion serves to extend and retract the articulated arm transfer device.

The inner shaft is longer than the outer shaft, and the extremity of the inner shaft outside the vacuum chamber extends beyond the corresponding extremity of the outer shaft. A brake 66 comprising a disk 67 of magnetic material is supported on the outer surface of the outer shaft 63, and cooperates with a disk 68 of magnetic material which is slidably supported inside a casing 69 of non-magnetic, vacuum-tight material. A magnetic coil 70, when energized, magnetizes the disks 67, 68 so that they press against each other and act as a brake, preventing rotation of the outer shaft 63. Similarly, a brake 71 comprising a disk 72 of magnetic material is supported on the outer surface of the outer shaft 63, and cooperates with a disk 73 of magnetic material which is slidably supported on the inner shaft 64. A magnetic coil 74, when energized, magnetizes the disks 72, 73 so that they press against each other and act as a brake or coupling locking the shafts to each other. A motor 75, constructed similarly to the construction of rotor 9 and stator 10 of FIG. 1, serves to rotate the inner shaft 64. More specifically, a rotor 76 is supported on the outer surface of the inner shaft 64, and a corresponding stator 77 is supported outside the rotor 76. The stator 77 is part of a drive which rotates the inner shaft 64. The rotor 76 is inside the vacuum and the stator 77 is outside the vacuum.

The rotor-stator pair 76, 77 may form part of a conventional brushless DC motor such as the M & K Series manufactured by MFM Technology, Inc., 200 Thirteenth Avenue, Ronkonkoma, N.Y. 11779.

Rotary motion is imparted to the inner shaft 64 by well-known servomechanism techniques, wherein a suitable signal is applied to the coils of the stator 77.

A disk 78 is affixed to the outer extremity of the inner shaft 64. This disk has a coded pattern of opaque portions which pass through a suitable encoder 79 (which may comprise, for example, a light-emitting-diode housing and a read head, from which a signal is transmitted to the appropriate external circuit through a signal feedthrough). The shafts 63, 64 are supported upon suitable bearings 65, 80 between the shafts 63, 64 and suitable bearings 81, 82 between the outer shaft 63 and the casing 69.

The casing 69 is of special configuration, and provides an important part of the wall which separates the evacuated regions of the device from the atmospheric-air regions of the device.

Vertical motion may be imparted to the shafts by vertical movement of the casing 69 in a manner hereinbefore described in connection with FIG. 1.

The casing 69 has a portion which passes between the rotor 76 and stator 77, and sufficient clearance must be provided between the rotor 76 and the casing 69.

Having thus described the principles of the invention, together with illustrative embodiments thereof, it is to be understood that although specific terms are employed, they are used in a generic and descriptive sense and not for purposes of limitation, the scope of the invention being set forth in the following claims.

I claim:

1. A transport apparatus having a movable arm assembly operably connected to a drive mechanism, the drive mechanism comprising:

a housing having a chamber;

two electro-magnetic stators stationarily connected to the housing at different heights relative to the chamber, the stators being located outside of the chamber; and a drive shaft assembly located, at least partially, in the chamber, the assembly including two independently rotatable coaxial shafts, a first one of the shafts extending coaxially through a second one of the shafts, each shaft having a set of permanent magnets that are aligned with a separate one of the electro-magnetic stators.

2. An apparatus as in claim 1 wherein the housing includes two drive housings connected one on top of the other.

3. An apparatus as in claim 2 wherein the two drive housings are connected by an adapter that forms a seal between the two drive housings.

4. An apparatus as in claim 2 wherein a first one of the stators is directly connected to a first one of the drive housings and a second one of the stators is directly connected to a second one of the drive housings.

5. An apparatus as in claim 1 further comprising two bearings between each one of the first and second coaxial shafts and the housing.

6. An apparatus as in claim 1 further comprising a vertical movement mechanism connected to a top of the housing for moving both the housing and drive shaft assembly in vertical directions.

7. An apparatus as in claim 6 wherein the housing is connected to a mounting flange of the apparatus by the vertical movement mechanism.

8. An apparatus as in claim 7 further comprising an expandable seal that surrounds the drive shaft assembly located between the mounting flange and the housing.

9. An apparatus as in claim 1 further comprising means for independently sensing the angular position of each of the first and second shafts relative to the housing.

10. An apparatus as in claim 9 wherein the means for sensing includes two optical disks connected to the drive shaft assembly, each one of the disks being fixedly connected to a separate one of the coaxial shafts, and two disk readers stationarily connected to the housing at separate spaced locations in the chamber.

11. A transport apparatus having a movable arm assembly operably connected to a drive mechanism, the drive mechanism comprising:

a mount;

a housing movably connected to the mount by a vertical movement mechanism, the housing having a chamber area;

two electro-magnetic stators connected to the housing at different heights relative to the chamber area, the stators being located outside of the chamber area; and a drive shaft assembly located, at least partially, in the chamber area, the assembly including two independently rotatable coaxial shafts, a first one of the shafts extending coaxially through a second one of the shafts, each shaft having a set of permanent magnets that are aligned with a separate one of the electro-magnetic stators.

12. An apparatus as in claim 11 wherein the housing including two drive housings connected one on top of the other.

13. An apparatus as in claim 12 wherein the two drive housings are connected by an adapter that forms a seal between the two drive housings.

14. An apparatus as in claim 12 wherein a first one of the stators is directly connected to a first one of the drive housings and a second one of the stators is directly connected to a second one of the drive housings.

15. An apparatus as in claim 11 further comprising two bearings between each one of the first and second coaxial shafts and the housing.

16. An apparatus as in claim 11 further comprising an expandable seal that surrounds the drive shaft assembly located between the mount and the housing.

17. An apparatus as in claim 11 further comprising means for independently sensing the angular position of each of the first and second shaft relative to the housing.

18. An apparatus as in claim 17 wherein the means for sensing includes two optical disks connected to the drive shaft assembly, each one of the disks being fixedly connected to a separate one of the coaxial shafts, and two disk readers stationarily connected to the housing at separate spaced locations in the chamber.

19. An apparatus as in claim 1 wherein the movable arm assembly comprises a first driving arm connected to the first shaft, a second driving arm connected to the second shaft, and a link structure comprising two separated pairs of driven arms, and wherein each pair of driven arms are connected to a separate end effector, and one driven arm from each pair of arms is connected to the first driving arm and the other driven arm of each pair of arms is connected to the second driving arm.

20. An apparatus as in claim 11 wherein the movable arm assembly comprises a first driving arm connected to the first shaft, a second driving arm connected to the second shaft, and a link structure comprising two separated pairs of driven arms, and wherein each pair of driven arms are connected to a separate end effector, and one driven arm from each pair of arms is connected to the first driving arm and the other driven arm of each pair of arms is connected to the second driving arm.

21. A transport apparatus as in claim 1 wherein the chamber is a vacuum chamber and the stators are outside of the vacuum chamber.

22. A transport apparatus as in claim 11 wherein rotors on the drive shaft assembly having the permanent magnets and the stators form brushless DC motors.

23. A transport apparatus as in claim 11 wherein the chamber area is a vacuum chamber and the stators are outside of the vacuum chamber.

24. A transport apparatus as in claim 11 wherein rotors on the drive shaft assembly having the permanent magnets and the stators form brushless DC motors.

* * * * *